United States Patent [19]
Wendell et al.

[11] Patent Number: 5,103,121
[45] Date of Patent: Apr. 7, 1992

[54] INPUT BUFFER REGENERATIVE LATCH FOR ECL LEVELS

[75] Inventors: Dennis L. Wendell, Pleasanton, Calif.; James E. Demaris, Brush Prairie; Jeffrey B. Chritz, Vancouver, both of Wash.

[73] Assignee: National Semiconductor Corporation, Santa Clara, Calif.

[21] Appl. No.: 502,260

[22] Filed: Apr. 2, 1990

[51] Int. Cl.$^5$ .................. H03K 19/092; H03K 19/094
[52] U.S. Cl. .................................... 307/475; 307/451; 307/455
[58] Field of Search ............... 307/475, 451, 455, 480, 307/481

[56] References Cited

U.S. PATENT DOCUMENTS 4,724,343  2/1988  Le Roux et al. .................. 307/475
4,806,799  2/1989  Pelley, III et al. ................. 307/475
4,864,159  9/1989  Cornelissen ....................... 307/475

Primary Examiner—David C. Nelms
Assistant Examiner—Richard Roseen
Attorney, Agent, or Firm—Townsend and Townsend

[57] ABSTRACT

An imput buffer regenerative latch circuit useful in BiCMOS integrated circuits is presented. The ECL input signal terminal is connected to the base of a bipolar transistor. The emitter of the transistor is connected to one of two input/out nodes of a CMOS regenerative latch circuit by the source/drain path of a MOS transistor. The second input/output node is similar connected to the emitter of a second bipolar transistor by the source/drain path of a second MOS transistor. The base of the second bipolar transistor is held at a reference voltage midway in the ECL voltage range. Latching occurs very quickly when the CMOS latch is activated.

11 Claims, 2 Drawing Sheets

INPUT BUFFER REGENERATIVE LATCH FOR ECL LEVELS

BACKGROUND OF THE INVENTION

The present invention is related to clocked regenerative latch circuits, and, more particularly, to a high-speed latch circuits useful as input buffers in a BiCMOS integrated circuit.

BiCMOS integrated circuits are semiconductor devices in which bipolar technology is combined with complementary metal oxide semiconductor (CMOS) technology. In such an BiCMOS integrated circuit, the higher speed, greater power-consuming bipolar transistor circuits are located at the suitable locations in the semiconductor device to use the speed and drive capabilities inherent in bipolar transistors. The CMOS circuits are used wherever higher packing densities and lower power consumption of CMOS circuits are suitable.

Some BiCMOS integrated circuit communicate with the outside world with signal levels appropriate for bipolar logic circuits. CMOS level signals are used within the device. A common bipolar logic used in BiCMOS devices is emitter-coupled logic (ECL) which has a signal range from −0.9 to −1.7 volts. On the other hand, CMOS signals swing in a 5-volt range.

A goal, then, is to bring ECL signals into the BiCMOS integrated circuit and translated into CMOS levels as quickly as possible. A more general goal is to buffer and to translate ECL signals for use by the CMOS logic circuits. The present invention is a substantial advance toward that goal.

SUMMARY OF THE INVENTION

The present invention provides for a BiCMOS input buffer circuit having an input terminal for receiving an input signal. The buffer circuit has a MOS latch circuit with first and second input/output nodes. The latch circuit regeneratively latches into one of two bistable states upon activation by a control signal.

A first bipolar transistor has its emitter electrode connected to the first input/output node, while a second bipolar transistor has its emitter electrode connected to the second input/output node. The collector electrode of the first bipolar transistor is connected to a first voltage supply and the base electrode connected to the input terminal. Likewise the collector electrode of the second bipolar transistor is connected to the first voltage supply and a base electrode of the transistor is connected to a first voltage reference at a level approximately midway in the range of signals expected on the input terminal.

MOS transistors connected between the emitter electrodes of the first and second bipolar transistors and the respective first and second input/output nodes decouple the input/output nodes from the first and second bipolar transistor emitter electrodes when the MOS circuit is activated and the input signal is latched into the MOS circuit at a high speed.

DESCRIPTION OF SPECIFIC EMBODIMENTS

Figure 1:
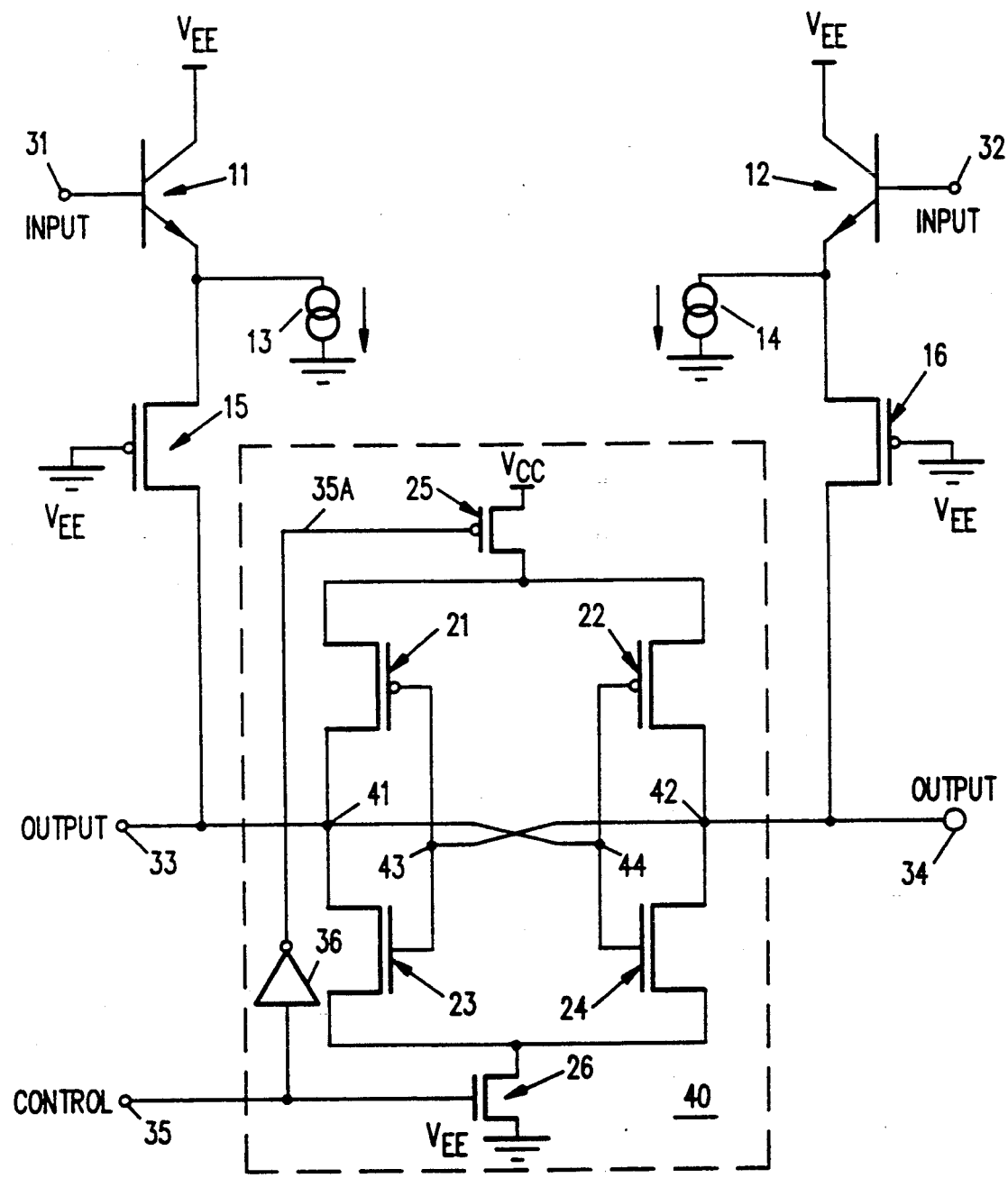
FIG. 1 is a circuit diagram of an embodiment of the present invention.

FIG. 1 is a circuit diagram of an embodiment of the present invention. The circuit has an input terminal 31 which receives ECL signals from an input pad (not shown). The ECL signals are regeneratively latched by a MOS latch circuit 40 which is activated by a control signal, such as a clock signal, on a terminal 35. The latch 40 has two complementary transistor pairs 21 and 23, 22 and 24, which are cross-coupled. The gate electrodes of the PMOS transistor 22 and NMOS transistor 24 are coupled by a node 44 to a common node 41 connected to the drain electrodes of the PMOS transistor 21 and the NMOS transistor 23. Similarly, the gate electrodes of the PMOS transistor 21 and the NMOS transistor 23 are coupled by a node 43 to a common node 42 connected to the drain electrodes of the PMOS transistor 22 and the NMOS transistor 24. The nodes 41, 42 are the input/output nodes of the latch 40.

The input terminal 31 is connected to the base electrode of an NPN bipolar transistor 11, which has its collector electrode connected to a first voltage supply at $V_{cc}$, here 0 volts, and its emitter electrode connected to the source electrode of a PMOS transistor 15. The drain electrode of the PMOS transistor 15 is connected to the input/output node 41 of the latch 40. The gate electrode of the transistor 15 is connected to the second voltage supply at $V_{EE}$, at −5.2 volts.

The input/output node 42 is connected similarly as the node 41. The node 42 is connected to the drain electrode of a PMOS transistor 16. The transistor 16 has its gate electrode tied to $V_{EE}$ and its source electrode to an emitter electrode of a NPN bipolar transistor 12. The transistor 12 has its collector electrode connected to the first voltage reference at $V_{cc}$ and its base electrode connected to a terminal 42 which is held at a reference voltage of $V_{BB}$ at −1.32 volts, approximately midway in the ECL range of −0.9 volts to −1.7 volts at the input terminal 31.

The bipolar transistors 11 and 12 are matching and both emitter electrodes are connected to current sources 13, 14 (really current sinks), respectively. These current sources 13, 14 draw current through the transistors 11 and 12 so that they remain on for instant operation. Each current source 13, 14 is implemented as a PMOS transistor having its source electrode connected to the emitter electrode of its respective bipolar transistor 11, 12. The drain and gate electrodes of the transistors are tied to $V_{EE}$ so that the transistors operate as a diode. The transistors are small compared to the PMOS transistors 15, 16 and are designed to draw just enough current to keep the bipolar transistors 11, 12 turned on.

Latching of the circuit 40 occurs when the control signal at the terminal 35 turns on NMOS transistor 26 and the PMOS transistor 25 under action of the inverter 36. The two transistors respectively connect one latch power supply node formed by the common source electrodes of the PMOS transistors 21, 22 to $V_{cc}$ and the other power supply node formed by the common source electrodes of the NMOS transistors 23, 24 to $V_{EE}$. In summary, when the control signal is high, electrical connection is made to the two power supplies.

The matching PMOS transistors 15 and 16 respectively decouple or isolate the emitter electrodes of the transistors 11 and 12 from the input/output nodes 41, 42 when the latch 40 is activated. The transistors 15, 16 effectively passes the voltages at the emitter electrodes of the transistor 11, 12 to the node 41, 42 at the initial stages of the latching operation. As the circuit 40 regeneratively latches by the action of the cross-coupled transistors, the voltages at the nodes 41, 42 are somewhat isolated from the emitter electrode of their respective transistors 11, 12 by the PMOS transistors 15, 16.

Figure 2:
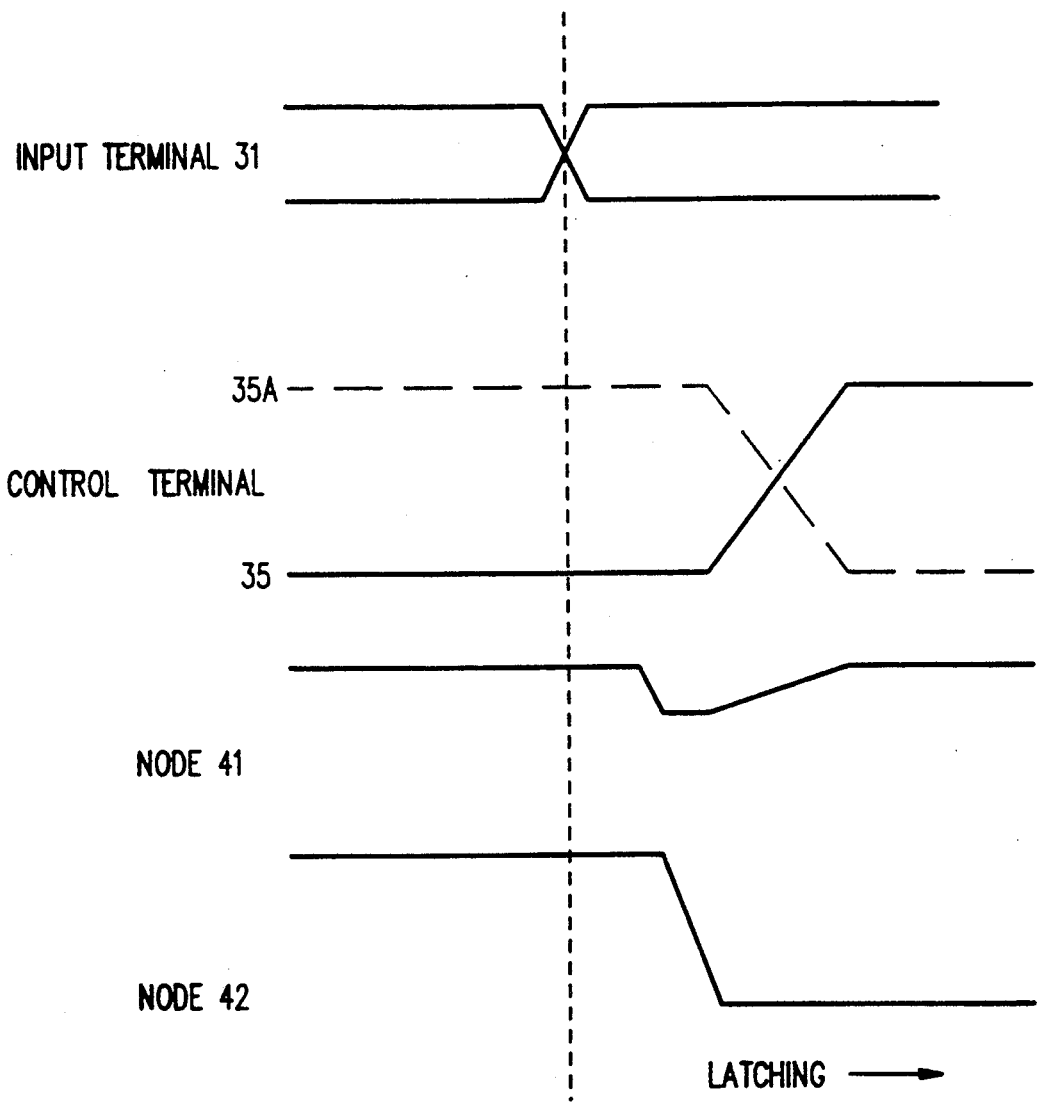
FIG. 2 is a timing diagram illustrative of the operation of the circuit shown in FIG. 1.

FIG. 2 illustrates the operation of the FIG. 1 circuit. Prior to the initiation of the latching operation, it should be noted that both input/output nodes 41, 42 are at a level set approximately one $V_{BE}$ below the level at the input terminal 31 and the reference terminal 32 at $V_{BB}$.

To initiate the latching operation the ECL input signal must be received at the input terminal and the nodes 41, 42 released. This initiation is marked by a dotted line in FIG. 1 and for purposes of illustration, it is assumed that the input signal is high.

Shortly after the ECL input signal is present at the input terminal, the latch 40 is activated by a high control signal at terminal 35. In the meantime voltages from the emitter electrodes of both transistors 11, 12 appear at their respective nodes 41, 42. A voltage of approximately −1.9 volts appears at node 41 since the transistor 11, in emitter-follower configuration, drops the high ECL signal (at −1.1 volts, for example) at its base electrode one $V_{BE}$ (−0.8 volts). The node 42 falls to −2.1 volts due to VBB at −1.32 volts on the base terminal of the transistor 12 and the one $V_{BE}$ drop of −0.8 volts.

As the control signal on the terminal 35 continues to rise, the latch 40 is activated and the regenerative action of the cross-coupled transistors 21-24 forces the nodes 41, 42 to latch to full CMOS voltage levels. The input signal is now set in the latch 40 and the signal is available as a CMOS differential signal at the output terminals 33, 34.

Conversely, a low ECL signal on the input terminal 31 causes the latch 40 to set into the opposite state. A low ECL signal of −1.6 volts, for example, creates a signal of −2.4 volts at the node 41. The node 42 receives a voltage of −2.1 volts as explained above. As the control signal on terminal 35 activates the latch 40, the node 41 falls to $V_{EE}$ while the node 42 rises to $V_{cc}$. No matter what the inherent ECL input signal is, the latching operation is fast because the speed at which the voltages from the emitter-follower transistors 11, 12 appear at the nodes 41, 42 is fast.

While the above is a complete description of the preferred embodiments of the invention, various alternatives, modifications and equivalents may be used. For example, the present invention has been described with one type of MOS regenerative latching circuit. It should be evident that by suitably modifying other regenerative MOS latch circuits, the present invention could be realized. Therefore, the above description should not be taken as limiting the scope of the invention which is defined by the appended claims.

What is claimed is:

1. A BiCMOS buffer circuit having an input terminal for receiving an input signal, comprising
    a MOS circuit for regeneratively latching into one of two bistable states upon activation by a control signal, said circuit having first and second input/output nodes;
    a first bipolar transistor having a collector electrode connected to a first voltage supply, a base electrode connected to said input terminal, and an emitter electrode coupled to said first input/output node;
    a second bipolar transistor having a collector electrode connected to said first voltage supply, a base electrode connected to a first voltage reference, and an emitter electrode coupled to said second input/output node;
    MOS transistor means connected between said emitter electrodes of said first and second bipolar transistors and said respective first and second input/output nodes for decoupling said first and second input/output nodes from said first and second bipolar transistor emitter electrodes when said MOS circuit is activated;
    whereby said input signal is latched into said MOS circuit.

2. The buffer circuit as in claim 1 wherein said first and second bipolar transistors are matching.

3. The buffer circuit as in claim 1 wherein said transistor means comprises
    a first MOS transistor having a first source/drain electrode connected to said emitter electrode of said first bipolar transistor, a second source/drain electrode connected to said first input/output node and a gate electrode to a second reference voltage; and
    a second MOS transistor having a first source/drain electrode connected to said emitter electrode of said second bipolar transistor, a second source/drain electrode connected to said second input/output node and a gate electrode to said second reference voltage.

4. The buffer circuit as in claim 3 wherein said first and second MOS transistors are matching.

5. The buffer circuit as in claim 4 wherein said first and second MOS transistors are PMOS transistors.

6. The buffer circuit as in claim 5 wherein said gate electrodes of said first and second MOS transistors are connected to said second voltage supply.

7. The buffer circuit as in claim 1 further comprising current source means connected to said emitter electrodes of said first and second bipolar transistors for maintaining said transistors in an on state.

8. The buffer circuit as in claim 1 wherein said first voltage reference is at a voltage level approximately midway in the range of signal voltages on said input terminal.

9. The buffer circuit as in claim 1 wherein said control signal is a clock signal.

10. The buffer circuit as in claim 1 wherein said MOS circuit comprises first and second power supply nodes, said MOS circuit activated by coupling said first power supply node to said first power supply and by coupling said second power supply node to a second power supply.

11. The buffer circuit as in claim 10 wherein said MOS circuit comprises cross-coupled pairs of complementary transistors.

* * * * *